United States Patent [19]
Prinz et al.

[11] Patent Number: 5,278,442
[45] Date of Patent: Jan. 11, 1994

[54] ELECTRONIC PACKAGES AND SMART STRUCTURES FORMED BY THERMAL SPRAY DEPOSITION

[76] Inventors: Fritz B. Prinz, 5801 Northumberland St.; Lee E. Weiss, 6558 Darlington Rd.; Daniel P. Siewiorek, 1259 Bellerock St., all of Pittsburgh, Pa. 15217

[21] Appl. No.: 730,226

[22] Filed: Jul. 15, 1991

[51] Int. Cl.⁵ ............................................ H01L 23/02
[52] U.S. Cl. ................................. 257/417; 257/467; 257/687; 257/706; 257/729
[58] Field of Search .............. 357/74, 71, 55, 30; 257/679, 687, 701, 702, 706, 723, 729, 417, 467

[56] References Cited

U.S. PATENT DOCUMENTS

| | | | |
|---|---|---|---|
| 3,880,633 | 4/1975 | Jordan et al. | 156/607 |
| 4,471,369 | 9/1984 | Anthony et al. | 357/55 |
| 4,665,492 | 5/1987 | Masters | 364/486 |
| 4,685,081 | 8/1987 | Richman | 357/87 |
| 4,709,254 | 11/1987 | Haghiri-Tehrani et al. | 257/679 |
| 4,752,352 | 6/1988 | Feygin | 156/630 |
| 4,811,082 | 3/1989 | Jacobs et al. | 357/74 |
| 4,924,291 | 5/1990 | Lesk et al. | 257/796 |
| 4,972,253 | 11/1990 | Palino et al. | 357/74 |
| 4,982,311 | 1/1991 | Dehaine et al. | 357/74 |
| 5,048,179 | 9/1991 | Shindo et al. | 257/679 |

FOREIGN PATENT DOCUMENTS

0322257 6/1989 United Kingdom ................. 39/42

OTHER PUBLICATIONS

"Three Dimensional Printing: Ceramic Tooling and Parts Directly From a CAD Model" by Emanuel E. Sachs, Michael Cima, James Cornie, David Brancazio and Alan Curodeau submitted to the National Rapid Prototyping Conference, Dayton, Ohio, Jun. 4-5, 1990.
"Automated Fabrication of Net Shape Microcrystalline and Composite Metal Structures Without Molds" by David Fauber, pp. 461-466, published in Manufacturing Processes, Systems and Machines, 14th Conference on Production, Research and Technology, National Science Foundation, Ann Arbor, Mich., Oct. 6-9, 1987.
"A Rapid Tool Manufacturing System Based on Stereolithography and Thermal Spraying" by Lee E. Weiss, E. Levent Cursoz, F. B. Prinz, Paul S. Fussell, Swami Mahalingham and E. P. Patrick, published by the American Society of Mechanical Engineers, 1990, pp. 40-48.
Product Sheet of Cerro Metal Products "Cerro Alloy Physical Data Applications".
"DC Arc-Plasma-The Future in The P/M Industry?" by Douglas H. Harris published by ASP-Materials, Inc., Dayton, Ohio.
"Polycrystalline Ferrite Films for Microwave Applications Deposited by Arc-Plasma" by D. H. Harris, J. R. Janowiecki, C. E. Semler, M. C. Willson and J. T. Cheng published in the Journal of Applied Physics, vol. 41, No. 2, 1 Mar., 1970.

*Primary Examiner*—Rolf Hille
*Assistant Examiner*—Roy Potter
*Attorney, Agent, or Firm*—Buchanan Ingersoll; Lynn J. Alstadt

[57] ABSTRACT

A smart structure or an electronic package is formed by thermal spraying utilizing a plurality of masks positioned and removed over a work surface in accordance with a predetermined sequence. The masks correspond to cross sections normal to a centerline through the structure. Masks are placed above a work surface and sprayed with either at least one primary material to form at least one electronic component and a complementary material. In this manner, layers of material form a block of deposition material and complementary material. Then, the complementary material which serves as a support structure during forming may be removed.

6 Claims, 4 Drawing Sheets

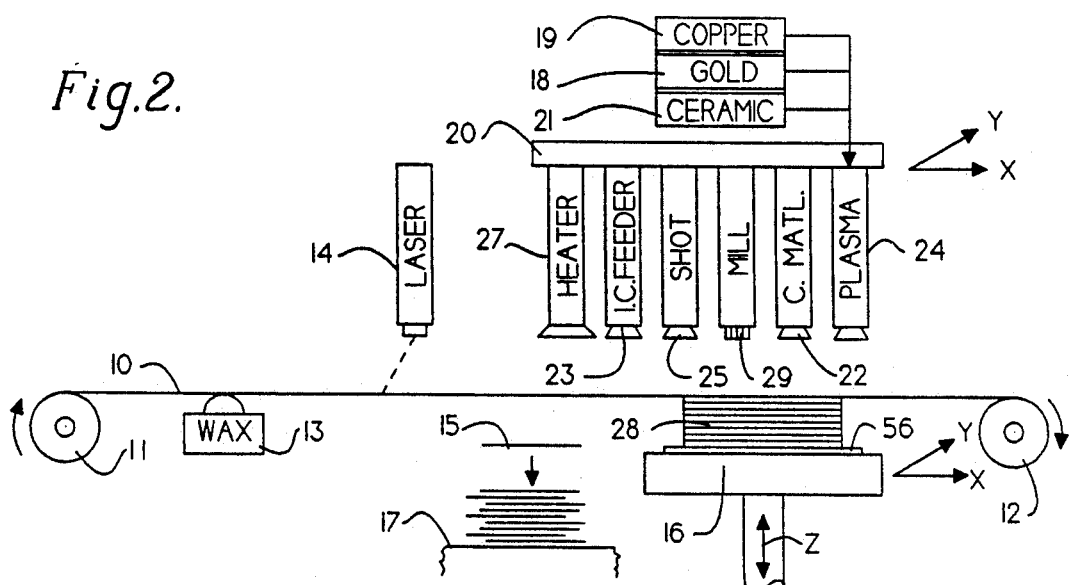
Fig.2.
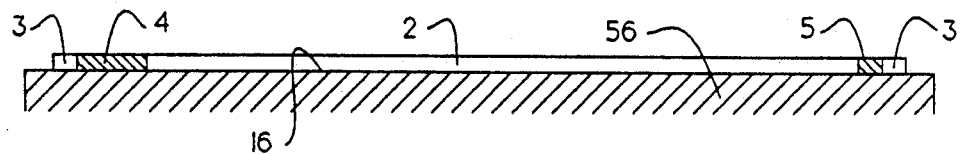
Fig.3.
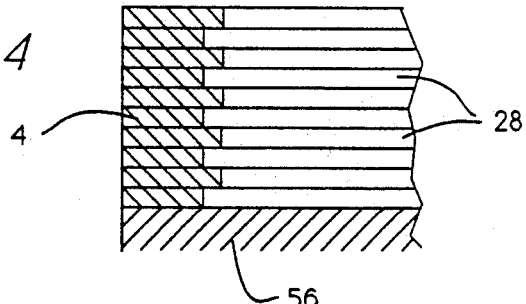
Fig.4
Fig.1.
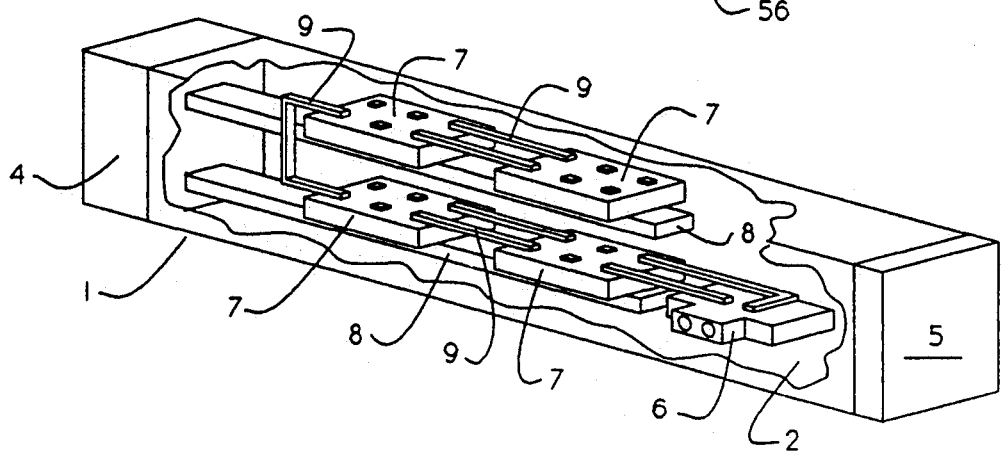

ELECTRONIC PACKAGES AND SMART STRUCTURES FORMED BY THERMAL SPRAY DEPOSITION

FIELD OF INVENTION

The invention relates to an electronic/mechanical packaging system and smart structures which house and interconnect electronic components.

BACKGROUND OF THE INVENTION

There are numerous structures known as smart structures which contain electronic components that produce an electrical signal when stimulated. These components could be strain gauges, switches, thermocouples or other electronic devices. Conventionally, these components have been attached to an existing structure rather than being fabricated in place at the same time the surrounding structure is made.

Electronic packages are another structure in which electronic components are surrounded by another material. Electronic components ranging from an individual integrated circuit chip to an array of interconnected chips have been packaged in protective containers. These containers are often designed to provide more than weather proofing. They may include shielding from electro magnetic interferences, thermal cooling and shock absorption. Blocks of styrofoam having cavities into which electronic devices and components are placed are commonly used today. Plastic encapsulation is another means for protectively packaging electronic components.

Many electronic packages are designed so as never to be opened. In these packages conductors are provided to interconnect the electronic components. An external connector in the package allows one to utilize the package components. Sometimes sensors have been provided in these packages.

Traditionally, the art has first formed the electronic components, interconnected them on a board and placed this system in a housing which may then be filled with a nonconductive material. Each of these steps is performed independently and final assembly involves mechanical connections between boards and the system housing. This manufacturing approach limits packaging density, performance, reliability and shape and requires several assembly steps.

At one time circuit boards were made by hand wiring components mounted on a board. In addition to being a slow process, this manufacturing approach had performance, reliability, shape and size limitations. Many of these problems were overcome by printing processes for circuit boards. In this process one or more layers of material were deposited on a substrate and then circuitry and other features were formed by etching. This printing process, however, is useful for only a limited number of materials and cannot be used for forming several different materials in a single layer.

The prior art contains several other methods for creating objects by the incremental material build up of thin layers. However, such techniques have been used primarily for products other than electrical components. These processes include lamination, selective laser sintering, ballistic particle manufacturing, three-dimensional printing, stereolithography and near net thermal spraying. Lamination involves the simple process of cutting layers of a selected material and then bonding those layers together. The layers may be pre-cut to shapes corresponding to a cross section through the article to be created. Alternatively, standard shapes of material can be stacked and bonded together. Then, the assembled structure is cut or machined to produce the desired shape. In U.S. Pat. No. 4,752,352, Michael Feygin proposes a computer controlled method and apparatus for forming a laminated object. He provides a supply station, a work station for forming a material into a plurality of layers for lamination, an assembly station for stacking the layers in sequence into a three-dimensional object, a station for bonding the laminations to complete the formation of the three-dimensional object and a control station. In his patent, Mr. Feygin discloses a method in which the laminations are cut from a roll of material lifted, stacked and bonded under the direction of a computerized controller. The layers are bonded together by adhesive or brazing. This and other lamination techniques have significant disadvantages. The bond between layers is critical and limits the strength of the object. Moreover, lamination is suitable for only those materials which can be formed into thin layers which can be bonded together.

In laser sintering, a laser is used to cure a starting material into a certain configuration according to the manner in which the laser is applied to that material. Stereolithography is a more recent yet similar process which creates plastic prototype models directly from a vat of liquid photocurable polymer by selectively solidifying it with a scanning laser beam. An example of this method is described in European Patent 322 257. Both of these methods require a substantial amount of curable raw material. In both cases the laser must be carefully controlled to achieve the desired shape. In some applications, the laser typically does not fully cure each cross section. Rather, the laser cures the boundary of a section and then cures an internal structure or honeycomb that traps the uncured fluid. Thereafter, the article must be subjected to final curing under separate ultraviolet lights or heat treatment. Additional post processing, such as careful sanding and grinding, is required for making smooth, accurate surfaces.

In ballistic powder metallurgy beams of particles are directed to the coordinates of a three-dimensional object in a three-dimensional coordinate system. A physical origination seed to which the particulate matter is attracted is required. The process may use a beam of particles directed to the origination seed which builds the particles upward from that seed. Alternatively, one can use an energy beam which attracts the particulate matter already in the environment to the seed or another coordinate. Such a system is disclosed by William E. Masters in U.S. Pat. No. 4,665,492. This method cannot be used to make objects having undercuts therein without creating support structures at the same time. Normally, the support structures are created with the particle beam during the creation of the object. Such support structures must be removed by cutting, grinding or machining. Furthermore, the art has only been able to reliably deposit wax with this method. The usefulness of this method for other materials has not and possibly cannot be established.

Three-dimensional printing is another technique similar to ballistic powder metallurgy. One variation of this technique creates layers of particles to produce a three-dimensional image in much the same manner that an ink jet printer produces two-dimensional images. The technique relies upon thermal shock or drop on demand material delivery techniques. A thermal shock technique forms a particle by vaporizing a small area of the fluid directly behind the nozzle. The drop on demand nozzle includes a piezo electric element to constrict the cavity thereby forcing a drop past the nozzle plate. In both instances the material is directed to a work surface in a manner to build up the article. This technique can only be used for certain kinds of materials.

In another variation of three-dimensional printing a series of two dimensional layers are created by adding a layer of powder on top of a work surface The powdered layer is selectively joined where the part is be formed by ink jet printing of a binder material The work surface is then lowered and another layer of powder is spread out and selectively joined. The layering process is repeated until the part is completely printed. Following a heat treatment the unbonded powder is removed leaving the fabricated part. Although this technique has been proposed for metal, ceramic and plastic materials, it is limited to those materials to which a reliable binder can be applied.

The art has attempted to make objects by spraying layers of metal on a substrate. Problems have occurred in that the layers have tended to camber and possibly to peel apart from the substrate. Therefore, one must have a release agent or compatible substrate.

None of the just described incremental material layer build up techniques have been successfully used to make packaged electronic components or smart structures.

There is a need for a method to manufacture electronic packaging systems and smart structures by incremental build-up of material. The method and apparatus should be capable of producing articles having undercuts and irregular shapes.

BRIEF DESCRIPTION OF THE INVENTION

We provide an electronic/mechanical packaging system and smart structures manufactured by incremental material build up of thin layers. Our package includes selected electronic components, many of which are formed in place, surrounded by a complementary material. This complementary material provides support during and possibly after manufacture of the structure. In most structures all or a portion of the complementary material is removed after the device has been formed. In other systems at least some of the complementary material remains in place to provide structural support or insulation or both. Most of the electronic components are formed in place by build up of thin layers. The electronic components may be made of conductors such as gold and copper, insulators such as ceramic materials and possibly semiconductors, all of which are applied by thermal deposition spray. We provide at least one mask per layer to properly position each of the sprayed materials within a layer. For most layers at least two masks are required. The first mask or set of masks corresponds to a cross section through the objects being formed within the package. The second mask or set of masks defines the location of the complementary material or materials within the layer. Two or more materials will be deposited to form most layers. For those layers we will have at least one primary mask which defines a cross section through the components in that layer and at least one complementary mask material which defines a complement to the cross section defined by the first mask. If more than one material is used to fabricate the components a separate mask should be used for each material. The masks are alternately placed on a work surface, sprayed with the appropriate material and removed. The masks are placed, sprayed and removed in accordance with a predetermined sequence so that a layered structure is built up which contains the components made of the primary material or materials surrounded by the complementary material or materials. During the build up of the layered structure, spaces may be created into which integrated circuits, conductors, batteries or other objects are placed. After such placements have occurred, additional layers are deposited on top of the objects to complete the structure. We further prefer to spray these materials according to a predetermined spray pattern to assure uniform distribution of the materials through each layer.

Other objects and advantages of the invention will become apparent in connection with the description of the preferred embodiments shown in the following figures in which comparable parts carry the same reference numeral.

DESCRIPTION OF THE DRAWINGS

FIG. 1 is a perspective view of a present preferred embodiment of our integrated electronic package.

FIG. 2 is a diagram showing a present preferred embodiment of our apparatus for making three-dimensional objects such as the package shown in FIG. 1.

FIG. 3 is a cross-sectional view of the initial layers of the package shown in FIG. 1 deposited on a substrate.

FIG. 4 is an enlarged fragmentary view of a portion of the layers shown in FIG. 3.

DESCRIPTION OF THE PREFERRED EMBODIMENTS

Figure 5:
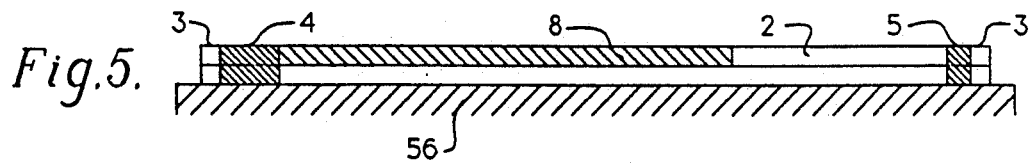
FIG. 5 is a cross-sectional view showing the layers which contain the heat pipe in the package of FIG. 1.
Figure 6:
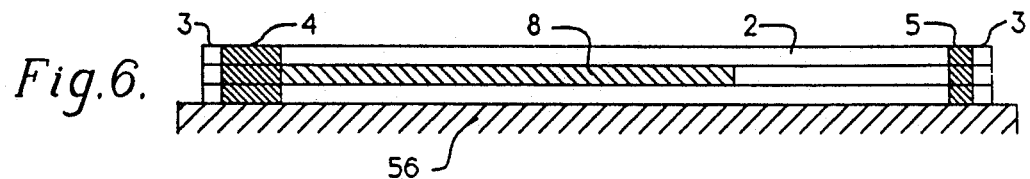
FIGS. 6 and 7 are cross-sectional views showing the layers of complementary material on top of the heat pipe before and after milling.
Figure 7:
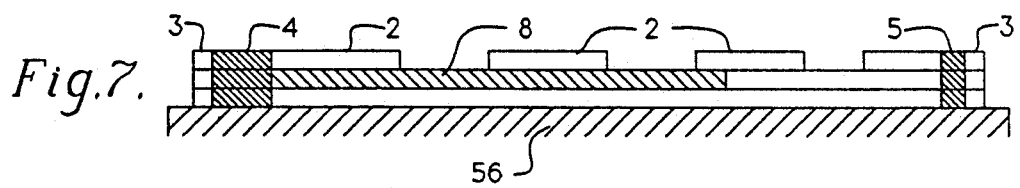
Figure 8:
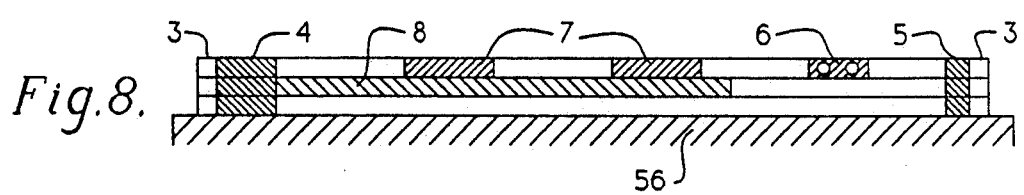
FIG. 8 is a cross-sectional view similar to FIG. 7 after leadless integrated and external connector circuits have been placed in the milled spaces.
Figure 9:
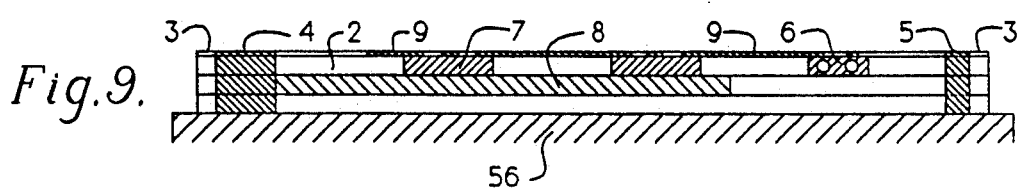
FIGS. 9 and 10 are cross-sectional views showing the layers deposited on top of the integrated circuits which contain conductors.

In FIG. 1 we show an electronic/mechanical package system 1 which can be manufactured in accordance with our method. This article is comprised of a central portion of a complementary material 2 between ends 4 and 5 which complementary material contains integrated circuits 7, heat pipes 8 and conductors 9. A connector 6 also is provided to connect the components to other devices (now shown). In this embodiment end 4 serves as a heat sink and end 5 provides electronic-magnetic interference shielding. The integrated circuits are positioned on heat pipes 8 and are connected together through conductors 9.

Figure 12:
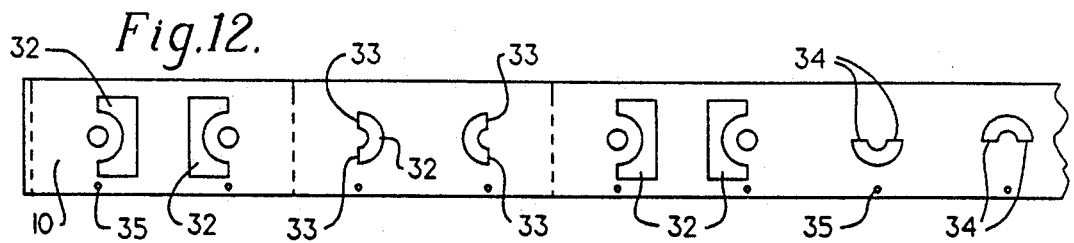
FIG. 12 is a top plan view of a strip of mask material having been cut to form different masks.
Figure 15:
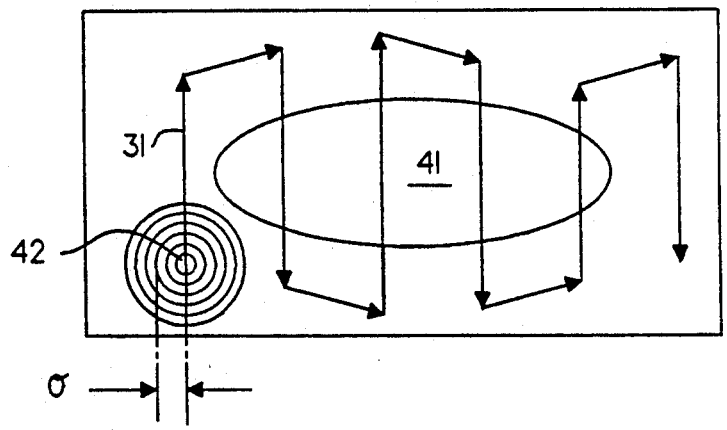
FIG. 15 is a diagram showing a thermal spray pattern using a single spray gun for practicing our method.

To make the electronic/mechanical package of FIG. 1 we may use the device diagramed in FIG. 2. There we provide a masking material 10 in roll form on roller 11 which passes through the apparatus to take-up roll 12. At station 13 wax or an adhesive material can be applied to the under surface of the masking material or one could use pressure sensitive paper. The mask material may be a metal foil, paper, reinforced paper or other suitable material. If a thin film or paper is used then the thermal spray may cause sections of the mask to move around under the spray turbulence. Therefore, a "sticky" surface may have to be applied to the backside of the roll, for example with a waxer 13, to hold the mask in place against the substrate. Alternatively, one could use pressure sensitive paper for the masks. We have found that paper can be used as a masking material for making an object of steel, copper or gold utilizing a low melting point alloy as the complementary material. As the masking material passes under laser 14 a mask is cut by the laser. The cut away portion 15 of the masking material 10 drops from the moving mask material onto a surface 17 for disposal. The masking material continues to a position over a work table 16 where it stops. The work table preferably is capable of moving in three directions as indicated by arrows x, y and z. As shown in FIG. 12, fiducial markers 35 may be cut out to provide for precise alignment of the mask 10 over the substrate 56 which has been deposited or placed on table 16. The table 16 is seated on a set of servo controlled x-y-z (and perhaps rotary) stages The x-y stages may be integrated with an optical sensing system, which detects the fiducial markers, to precisely align the mask over the substrate. The z-stage drops the substrate by the thickness of each layer, between consecutive layers When the mask material reaches a desired position above table 16, head 20 is moved in a manner to direct the delivery of a primary material such as gold from supply 18, copper from supply 19 or ceramic from supply 21 through plasma gun 24 or a complementary material ("C. MATL.") such as Cerro metal through gun 22. If desired, one spray gun could be used for all materials or a separate spray gun could be used for each material. The spray guns move in a predetermined pattern. One preferred pattern of motion is shown in FIG. 15. A sequence of masks, are moved over the table. Layers 28 of deposition material and complementary material are deposited on the work table. After each layer is completed, work table 16 is dropped to allow for deposition of the next layer. Although we prefer to move the spray guns during deposition, one could also use a fixed spray gun and move the work surface 16. We also prefer to provide a mill head 29 or other device to create spaces in the layers into which integrated circuit chips are placed. Such spaces could be created by machining, laser obliteration, and heating to melt away selected portions. An integrated circuit chip (I.C.) feeder 23 is provided to place these chips into the milled spaces.

The art has observed in some metal spray processes that residual stress develops in the sprayed metal layer causing the layer to camber and possibly to peel. To relieve the stress the art has vibrated or shot peened such layers. Shot peening is only successful in situations where shot is evenly applied over the layer. Since our layers are flat, we can use this technique. Therefore, we prefer to provide a shot peener 25 for shot peening each layer. The layers could be vibrated through movement of the table 16.

It is also possible to relieve the stress by induction heating, flame heating or hot pressing. Therefore, we alternatively provide a heat source 27 which we move over each layer to selectively heat the surface. This heat source could be a hot press, a flame heater or an induction heater. Such heating is easier to accomplish on flat layers rather than on curved and irregular surfaces.

Figure 10:
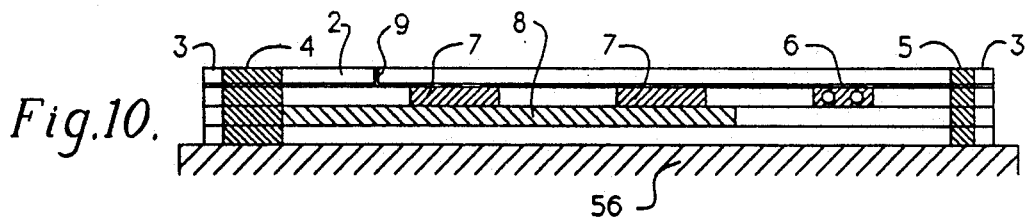
Figure 11:
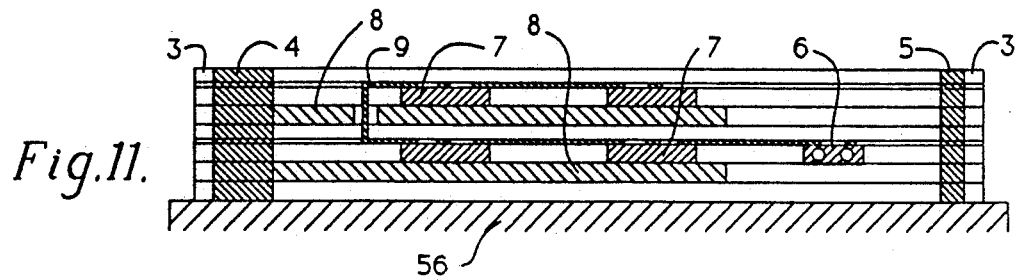
FIG. 11 is a cross sectional view of the completed package of FIG. 1 before removal of the outside complementary material.

The layering process used to create the package of FIG. 1 is shown in FIGS. 3 thru 11. We begin by depositing the first layer on a substrate 56 as shown in FIG. 3. That layer includes ends 4 and 5, complementary material 2 between ends 4 and 5 and outside sacrificial complementary material 3 which could be the same material as used for the substrate 56. The sacrificial complementary material 3 provides a surface to support the masks which define ends 4 and 5. That material is removed after the layering process has been completed. Then we deposit layers forming ends 4 and 5 adjacent a center portion of complementary material 2. We prefer to overlap adjacent layers, 28 of end 4 and complementary material 2 as shown in FIG. 4. This overlap provides improved bonding Next we deposit layers forming the heat pipe 8 and adjacent complementary material 2. We continue to apply layers of complementary material 2 on top of the heat pipe and then mill spaces 39 in those layers. Next we place leadless integrated circuits 7 or external connector 6 in the spaces 39. Then we deposit conductors 9 and complementary material 2 on top of the integrated circuits as shown in FIG. 10. To form the remainder of the electronic components and packaging surrounding them, we repeat the steps illustrated in FIGS. 5 thru 9 thereby forming the structure of FIG. 11. Finally, we must remove the sacrificial complementary material 3 from the structure of FIG. 11 to complete the package of FIG. 1.

A primary purpose of the complementary material is to provide support or spacing for portions of products being formed. Frequently, that support material will be removed before the product is used. In other products such as electronic packages, little or none of the complementary material is removed. Hence, complementary material, as used herein, should be understood to encompass both sacrificial materials and nonsacrificial materials which complement the material or materials deposited to form the product or electrical component within the product. Because at least some complementary material usually is removed, we prefer that some of the complementary materials have a melting point lower than the melting point of the material used to form the ends and electrical components. If that occurs the structure shown in FIG. 11 can be heated to a temperature so that complementary material 2 and outside complementary support material 3 can be melted away from the object. If material 2 has a higher melting point than outside complementary material 3, the structure could be heated to remove only the outside complementary material. Alternatively, one could use selective heating techniques to remove some but not all of complementary material 2. Complementary material could also be removed by other processes such as milling or etching. We have found that if the article is to be fabricated in steel or zinc a metal alloy or polymer having a melting temperature between approximately 150° to 340° F. makes a suitable complementary material. Such alloys are manufactured by Cerro Metal Products Company of Bellefonte, Pa., and sold under the trademark Cerro.

Since each layer is comprised of at least two materials, at least one mask per layer may require an "island" feature (i.e., a region unconnected to the main roll), which is physically not realizable. For example, if a cross section is a circle, then the support structure mask would require a frame with a circular island. To handle this situation, we may use two masks, and thus two spray sequences, to form "island" features as shown in FIG. 12. Thus, if a particular layer of the main shape has holes in it, then at least four masks 32 are required; two to form the complementary material (e.g. Cerro metal) and two to form the primary material.

With the aforementioned approach there may be seams in the spray deposition between boundaries of contiguous sections formed with two masks. This may be deleterious to the over-all part strength and its fatigue characteristics. To minimize this problem, the masking operations should be planned so that the seams between consecutive layers do not align but criss-cross. For example, FIG. 12 shows the masks for two layers of a cylinder. Here corresponding edges 33 and 34 for two mask pairs are positioned so that edges 33 are at right angles to edges 34.

Figure 13:
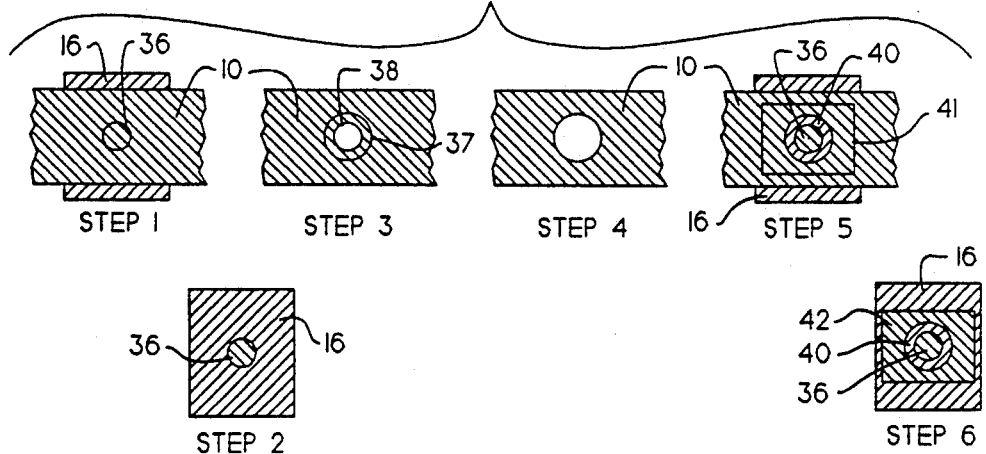
FIG. 13 is a diagram showing an alternate sequence for cutting mask material.

Yet another way to create a circular island feature is shown in FIG. 13. First at step 1 we position the table 16 under the mask material 10 and make a circular cut to produce a circular mask 36 which we leave on the table 16 as shown at step 2. Then at step 3 we move the table 16 away from the mask material 10 and make cut 37. Cut 37 produces a donut 38 of mask material which falls away leaving the mask of step 4. Then at step 5 we move the table 16 with circular mask 36 under mask material 10 thereby defining circular area 40 to be sprayed. At that stage we can spray over the mask material. Alternatively, we can cut a border 41 to form mask 42 and move the table with masks 36 and 42 to another location for spraying as indicated by step 6.

Figure 14:
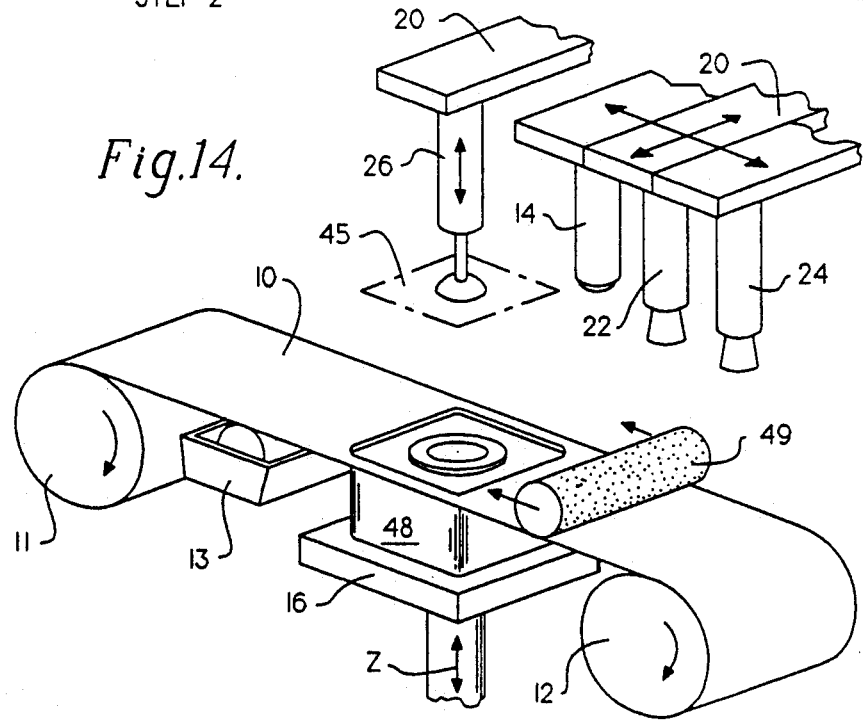
FIG. 14 is a diagram of a second preferred embodiment of our apparatus.

An alternative apparatus for making the article of FIG. 1 is shown in FIG. 14. This embodiment avoids the problem produced by "island" features by first advancing the uncut mask material 10 over the substrate comprised of a block of deposited material 48 on table 16 and then cutting the mask directly on the substrate 48. The depth of penetration of the laser cutting action would have to be carefully controlled so as not to distort the substrate. The backside of the mask material 10 must be "sticky" so that "islands" adhere to the substrate. In this embodiment, additional mechanisms such as suction devices 26 or grippers (not shown) would be required to remove the cutout portions 45 of the masks 10 before spraying proceeds and to remove portions of the mask, which are not connected to the roll, after each section is sprayed. We provide the same mask material 10 traveling from supply wheel 11 to take up wheel 12. Once again wax or adhesive is applied to the underside of the mask material. Layers of the primary material or materials from which the electronic components and connectors are made along with the complementary material are deposited on work table 16. In this arrangement, however, the mounting head 20 contains not only the deposition spray guns 22 and 24, but also laser 14 which is used to cut the mask material and the suction 26. Each of these sources is shown in FIG. 14 to be mounted on separately moveable segments of the mounting head 20. It should, therefore, be understood that separate mounting heads could be provided for each spray head or for selected combinations of spray heads. In the apparatus of FIG. 14 the mask material 10 is fed over work table 16. Mounting head 20 is moved so that laser 14 is positioned above the mounting table 16. The mounting head then moves to direct the laser to cut away a portion of the mask material corresponding to the cross-sectional area to be sprayed. Then mounting head 20 is moved so that the cut away mask material attached to suction 26 can be discarded. Then, the mounting head moves the appropriate spray head 22 or 24 over the mask material so that either a primary material or a complementary material can be sprayed over the mask 10 onto the work table. Additionally, appropriate mechanisms (not shown) would be required to move the laser cutter 14 and the spray sources 22 and 24 in and out of the common workplace. However, a precision x-y alignment source under the substrate would not be required with this second approach. This process continues in sequence until all of the various layers have been deposited to make the work piece. Thereafter, the block of deposited material 48 is handled in the same manner as occurred with the structure shown in FIG. 11.

For each layer, one series of masks is required to define the shape of the primary deposition material (e.g. steel), and another series of masks is required to define the shape of the support structure comprised of complementary material. The spray deposition must be uniform within the bounds of the masks to achieve a uniform deposition thickness.

The mask production/spray methods so far disclosed require extremely tight control of the spray deposition to assure that a uniform, constant and repeatable thickness of material be deposited for each layer. Also, the complementary material and primary material masks for each layer, must be accurately registered to assure a perfect boundary between the deposited support and primary materials. This shortcoming can be alleviated by providing a milling or grinding tool 50 to "face" each layer to the exact thickness after each layer is deposited. With this approach, only a primary material mask is required. First the mask for the primary material is cut by any of the previously disclosed means. The primary material is sprayed. The mask is then removed. Complementary material is sprayed directly over that entire layer filling in the region adjacent to the just sprayed primary material as well as covering the top of that material. Although the spraying could be done without a mask, we prefer to use a marks to define the boundaries of the object as does mask edge 54 in FIG. 14. A milling head or a grinding wheel 49 (or a combination of these) then passes over that layer removing that portion of the complementary material which covers the primary material and trimming that layer to the exact thickness. The resulting milled surface should be sufficiently rough to assure bonding of the next layer to be deposited thereon. The process is then repeated for each layer until the final block of material is produced. In some applications it may be desirable to mill the primary material in a given layer before applying the complementary material and then mill the entire layer after the complementary material has deposited.

Figure 16:
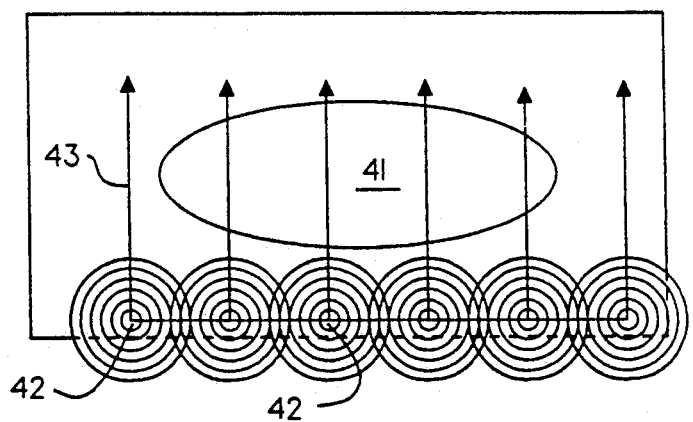
FIG. 16 is a diagram showing a multiple spray pattern using multiple spray sources.

Conventional thermal spray sources typically produce approximately Gaussian distributions. One method of producing a uniform distribution is to use a multiplicity of appropriately spaced Gaussian distribution spray patterns The summation of identical Gaussian distributions which are spaced apart by not more than 1.5 standard deviations produces an approximately uniform distribution in the plane passing through line 46 in FIG. 16 running between the center axis of the first Gaussian source and the center axis of the last Gaussian source. An approximately uniform distribution will also occur in all planes of similar length parallel to the plane passing through line 46. This uniform distribution will occur independent of the number of sources. Thus, a uniform distribution may be achieved by spraying multiple passes with a single source as shown in FIG. 15. Here a spray head 42 produces a spray pattern indicated by concentric circles 30. The pattern has a standard deviation $\sigma$. The spray head is moved along path 31. All passes must be parallel and preferably are spaced by not more than 1.5 standard deviations $\sigma$. The bounds of the source spray must extend beyond the mask shapes 41 onto the mask material 10. Alternatively, a uniform distribution can be achieved using a set of sources 42 shown in FIG. 15 and spraying in a single pass, indicated by arrows 43. There are enough sources 42 to cover the limits of the largest mask boundaries. The multiple source method would produce faster cycles times and may be more precise relative to the single source method.

Figure 17:
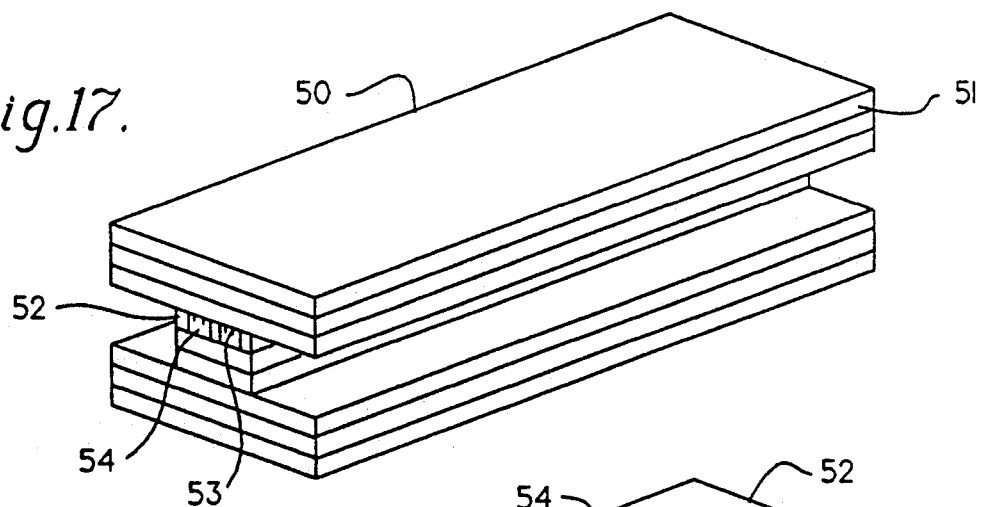
FIG. 17 is a perspective view of a smart I-beam structure.
Figure 18:
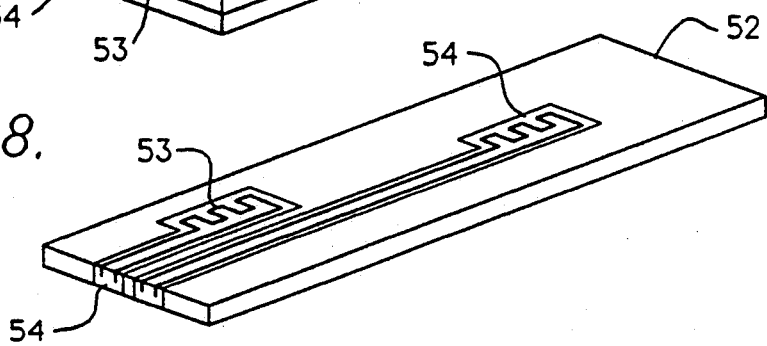
FIG. 18 is a perspective view of a layer removed from the smart structure of FIG. 17 to show the sensors formed therein.

We can also make smart structures such as the I-beam 50 shown in FIG. 17. This I-beam has several layers 51. In some of those layers such as layer 52 shown in FIG. 18, we have formed a strain gauge 53 and insulator 54 through the deposit of appropriate materials in the manner illustrated in FIG. 2. Because we have deposited surrounding complementary material (not shown) with the primary materials that form the I-beam 30, gauge 53 and insulator 54, we are able to create intricate shapes and parts like the I-beam 50 of FIG. 17 having undercut portions. The complementary material supports the top of the I-beam during forming.

While we have described certain preferred embodiments of our apparatus and method, it should be distinctly understood that our invention is not limited there, but may be variously embodied with the scope of the following claims.

We claim:

1. An electronic/mechanical structure comprised of layers which layers were formed by spray deposition of at least one primary material and complementary material adjacent said at least one primary material, at least one primary material forming a casing and forming at least one of an electrical conductor and a heat conductor, the electronic/mechanical structure also containing embedded therein at least one of a strain gauge, a capacitive switch and a thermocouple, and a structure which produces an electrical signal when activated by one of a mechanical force and a temperature change.

2. The structure of claim 1 wherein at least one primary material is one of a metal, a ceramic, and a plastic.

3. The structure of claim 1 wherein at least two adjacent layers interlock.

4. The structure of claim 1 wherein at least one of a strain gauge, a capacitive switch and a thermocouple is formed by spray deposition of at least one layer.

5. The structure of claim 1 wherein at least one mechanical component is a prefabricated component placed within at least one layer.

6. The structure of claim 1 wherein at least one primary material and the secondary primary material are identical materials.

* * * * *